(12) United States Patent
Bartha et al.

(10) Patent No.: US 12,032,524 B2
(45) Date of Patent: Jul. 9, 2024

(54) DATA DECOMPRESSION APPARATUS

(71) Applicant: FotoNation Limited, Galway (IE)

(72) Inventors: Lorant Bartha, Comina Micfalau (RO); Norbert Lajtai, Brasov (RO)

(73) Assignee: FotoNation Limited (Xperi Inc.) (IE)

( * ) Notice: Subject to any disclaimer, the term of this patent is extended or adjusted under 35 U.S.C. 154(b) by 275 days.

(21) Appl. No.: 17/686,367

(22) Filed: Mar. 3, 2022

(65) Prior Publication Data
US 2023/0281164 A1    Sep. 7, 2023

(51) Int. Cl.
G06F 16/174    (2019.01)
G06N 3/02      (2006.01)
H03M 7/30      (2006.01)

(52) U.S. Cl.
CPC ........... G06F 16/1744 (2019.01); G06N 3/02 (2013.01); H03M 7/6005 (2013.01)

(58) Field of Classification Search
CPC ..... G06F 16/1744; G06N 3/02; H03M 7/6005
See application file for complete search history.

(56) References Cited

U.S. PATENT DOCUMENTS

| | | | | |
|---|---|---|---|---|
| 5,027,376 A | * | 6/1991 | Friedman | H03M 7/42 375/240 |
| 5,576,765 A | * | 11/1996 | Cheney | H04N 19/00 375/E7.093 |
| 5,898,710 A | * | 4/1999 | Amrany | H03M 13/2742 714/701 |
| 5,951,623 A | * | 9/1999 | Reynar | H03M 7/3086 358/1.9 |
| 6,031,622 A | * | 2/2000 | Ristow | G06K 15/02 358/1.11 |
| 8,700,579 B2 | | 4/2014 | Apanowicz et al. | |
| 9,252,805 B1 | * | 2/2016 | Abali | H03M 7/6005 |
| 2007/0006009 A1 | * | 1/2007 | Clark | G06F 13/4027 713/400 |
| 2013/0132353 A1 | * | 5/2013 | Mande | G16B 30/00 707/693 |
| 2019/0190538 A1 | * | 6/2019 | Park | G06N 3/063 |
| 2021/0342285 A1 | * | 11/2021 | Seyedzadehdelcheh | G06F 13/4027 |
| 2022/0107919 A1 | * | 4/2022 | Suzuki | G06F 16/1744 |

FOREIGN PATENT DOCUMENTS

WO    2019042703 A1    3/2019

* cited by examiner

*Primary Examiner* — Mahesh H Dwivedi
*Assistant Examiner* — Huen Wong
(74) *Attorney, Agent, or Firm* — Lerner David LLP

(57) ABSTRACT

A decompression apparatus comprises a number of stages including: a first stage which always reads a binary symbol from a first stage indicator file for each symbol which is to be decoded; one or more mid stages which conditionally read a binary symbol from successive indicator files based on the value of the last symbol read from a previous indicator file; and a final stage which conditionally reads a symbol from a reduced file based on the value of the last symbol read from the last stage indicator file.

15 Claims, 4 Drawing Sheets

DATA DECOMPRESSION APPARATUS

FIELD

The present invention relates to a data decompression apparatus.

BACKGROUND

Entropy Coding is a lossless compression technique based on encoding more frequently occurring source symbols within a data set with shorter coded symbols, while less frequently occurring source symbols can have longer coded symbols. Where there is a large variance in frequency of source symbols, such coding can be optimal. However, the need to provide a dictionary, mapping all source symbols to coded symbols can mean that in certain cases, coding is less than optimal and that decompression may not operate as efficiently as it might.

U.S. Pat. No. 8,700,579 discloses a method for applying adaptive data compression in a relational database system using a filter cascade having at least one compression filter stage in the filter cascade. The method comprises applying a data filter associated with the compression filter stage to the data input to produce reconstruction information and filtered data, then compressing the reconstruction information to be included in a filter stream. The filtered data is provided as a compression filter stage output. The method comprises evaluating whether the compression filter stage provides improved compression compared to the data input. The filter stage output is used as the input of a subsequent compression filter stage.

SUMMARY

According to the present invention, there is provided a data decompression apparatus according to claim 1.

Embodiments of the invention provide a flexible, hardware-efficient apparatus for decompressing data in which there is a variation in the frequency of data symbols occurring within the data.

BRIEF DESCRIPTION OF THE DRAWINGS

Embodiments of the invention will now be described, by way of example, with reference to the accompanying drawings, in which.

DESCRIPTION OF THE EMBODIMENTS

Embodiments of the present invention comprise an apparatus for performing multi-stage decompression of data, where every stage involves the potential decompression of a symbol from within a source data set.

Efficient compression of a data set to be decompressed by apparatus according to the invention is based on each successive compression stage compressing the most frequently occurring data symbol remaining to be compressed within the data set at that stage.

In one particular, but non-limiting, application of the present invention, the data set comprises a compressed set of weights for a neural network which are to be de-compressed before being employed in the execution of the neural network. For example, for a neural network processing platform of the type described in PCT Application WO2019/042703 (Ref: FN-618-PCT), the disclosure of which is herein incorporated by reference, a neural network processor may from time to time need to read a neural network configuration from memory, possibly across a system bus. As will be appreciated, the main portion of network configuration information comprises the weights to be employed within the various layers of the neural network. It would be useful if these could be efficiently compressed in order to minimize the amount of memory required to stored network configuration information, but also to reduce bus bandwidth required, if reading the configuration information from memory across a bus. In either case, it would be useful if decompression could be performed with a minimal hardware footprint and with minimal latency.

The example provided below involves a data set comprising 4-bit symbols, although it will be appreciated that embodiments of the invention can be implemented with data symbols of any size, for example, 4, 8, 16, 32 or 64 bits and in some cases, data symbols can be employed which do not have a width equal to an integer power of 2.

Figure 1:
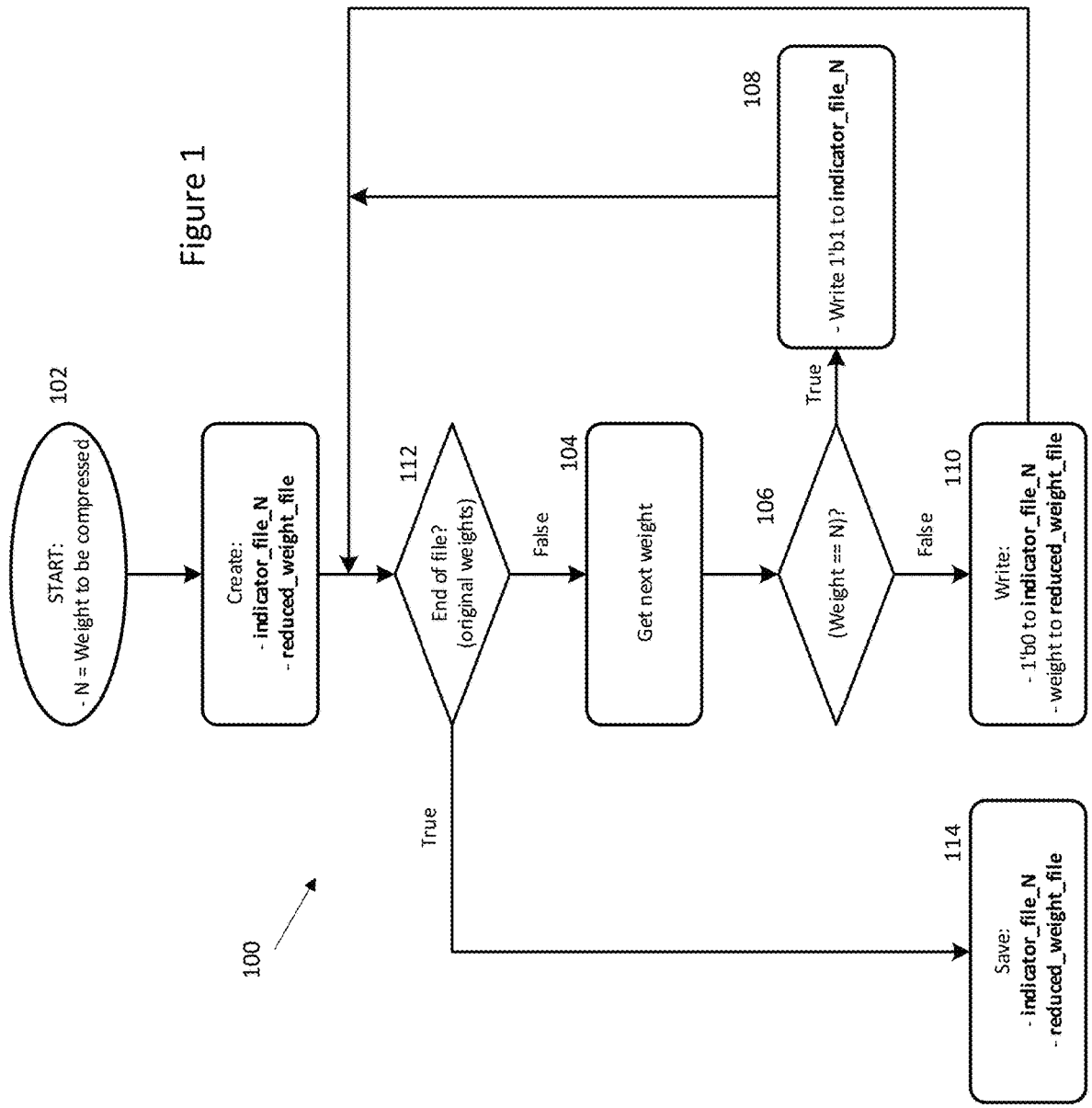
FIG. 1 illustrates single stage data compression for compressing data to be decompressed by an apparatus according to an embodiment of the present invention.

Referring now to FIG. 1, each compression stage 100 begins by determining the most frequently occurring symbol (weight) N within the data set to be compressed, step 102. For the first stage, the data set comprises the original data, whereas for each subsequent stage, the data set comprises a reduced or residual data set provided by a previous stage.

Step 102 can be partly performed before compression begins by analyzing the distribution of the data within the source data set, for example, by calculating a histogram. Thus, the most frequently occurring symbol is compressed by a first stage and the next most frequently occurring symbol is compressed by the next stage etc.

Doing so also enables a decision to be taken in relation to the number of compression stages to be applied to a particular data set. The number of symbols in the group of symbols with a frequency significantly above the average symbol frequency for a data set is a good indicator of the number of compression stages to be applied. For the source data set 200-1 of FIG. 2, symbols 0h, Fh and 1h have occurrences of 12, 7 and 7 respectively, significantly above the average of 2 for 16 possible symbol values in a data set of 32 symbols. Each of the remaining symbols only occurs once and so this points strongly to 3 stage compression being optimal.

Nonetheless, it will be appreciated that for other data sets, for example, where more than 3 different symbols dominate the source data, more than 3-stages of compression could be beneficial and clearly where the width of the data symbols is greater than 4 bits, it is more likely that more than 3 stages of compression will be useful. Correspondingly, if fewer than 3 symbols dominate a set of data, then fewer compression stages could be applied.

Each stage 100 produces two outputs (FIG. 2):
  a binary indicator file (202) comprising the same number of bits as an input data set (200) for the stage; and
  a reduced data set (204), in this case a file comprising a reduced set of symbols corresponding to all of the data symbols from the input data set (200) other than those corresponding to the data symbol N being compressed by the stage.

The stage reads the input data set 200, symbol-by-symbol. As long as there is a symbol remaining in the input data set, the stage gets the symbol, step 104, and the symbol is checked to determine if it corresponds to the selected symbol N for the stage, step 106. If so, a 1 is written to the binary indicator file, step 108. If not, a 0 is written to the binary indicator file and the value of the weight is written to the reduced data set, step 110.

If no more symbols are available, step 112, the indicator file 202 and the reduced data set 204 for the stage are saved, step 114, before the stage finishes.

Note that for the binary indicator file, a 0 could be used when the symbol matches the selected symbol N for a stage and 1 could be used where there is not a match.

Also the term file is used for the indicator file 202 and weight file 204, however, it will be appreciated that in many cases, their information may simply be streamed to or from memory and may not, at least initially, be serialized in non-volatile storage (not shown) i.e. the input data set 200 does not need to be in file format, it can simply be available in a block of memory.

Figure 2:
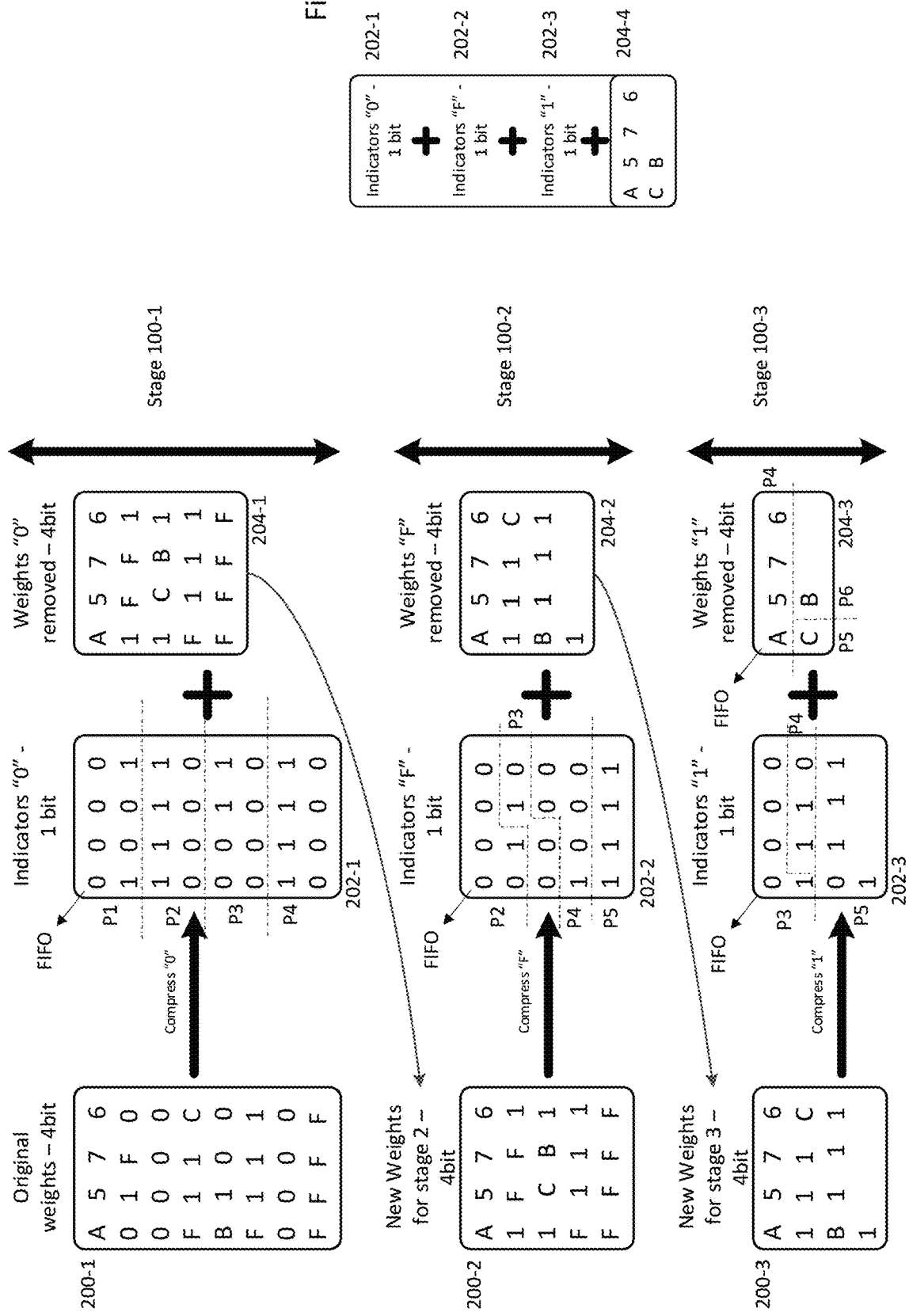
FIG. 2 illustrates a three-stage compression dataflow for a data set comprising 4 bit data symbols, in this case weights for use in processing a neural network, in which the most frequently occurring symbols are 0h, Fh (15d) and 1h respectively.

Referring to FIG. 2, where it can be seen that a first stage 100-1 acquires a source data set 200-1 comprising 32 data symbols, where the most frequent symbol value is 0h.

The stage produces an indicator file 202-1 indicating the position of each 0h with a 1b and 0b for all other symbol values. The weights file 204-1 corresponds to the original data set 200-1, with all instances of 0h removed. As there are 12d instances of 0h in the source data set 200-1, the difference in size between the two files is 48 bits. On the other hand, the size of word required to encode the binary indicator file 202-1 is 32 bits, so in this case achieving a potential saving of 16 bits (noting that an indicator that 0h is the symbol being encoded by stage 100-1 also needs to be provided).

The reduced weights file 204-1 now forms the source data set 200-2 for the second stage 100-2. This compresses based on the value Fh being the most frequently occurring remaining data symbol. As can be seen, performing the stage 100-2 produces an indicator file 202-2 with 7 1s in place of the instances of Fh in the source data set 200-2 and 0s for the remaining values. The weights file 204-2 produced by the stage is therefore 28bits smaller than the input data set, while the indicator file 202-2 comprises 20bits.

Finally, the weights file 204-2 is used as the source data set 200-3 for the 3$^{rd}$ stage 100-3 which compresses based on the value 1h being the most frequently occurring remaining data symbol. The 3$^{rd}$ stage produces a 13 bit indicator file 202-3 as well as a weights file 204-3 comprising the remaining weights.

The final compressed output from the 3 stages of compression comprises the 3 indicator files 202-1, 202-2. 202-3 comprising 32+20+13 bits as well as the weights file 204-4 from the 3$^{rd}$ stage comprising 6 weights.

It will be appreciated that a typical data set is much larger than the data set 200-1 shown and so the overhead of providing an indication of the symbol value being compressed by each stage is insignificant.

However, for a symbol frequency distribution along the lines of the data set 200-1 shown in FIG. 2, a compression of about 43% can be achieved. Of course, the number of compression stages could be increased, but in this particular example, this would not increase compression.

Figure 3:
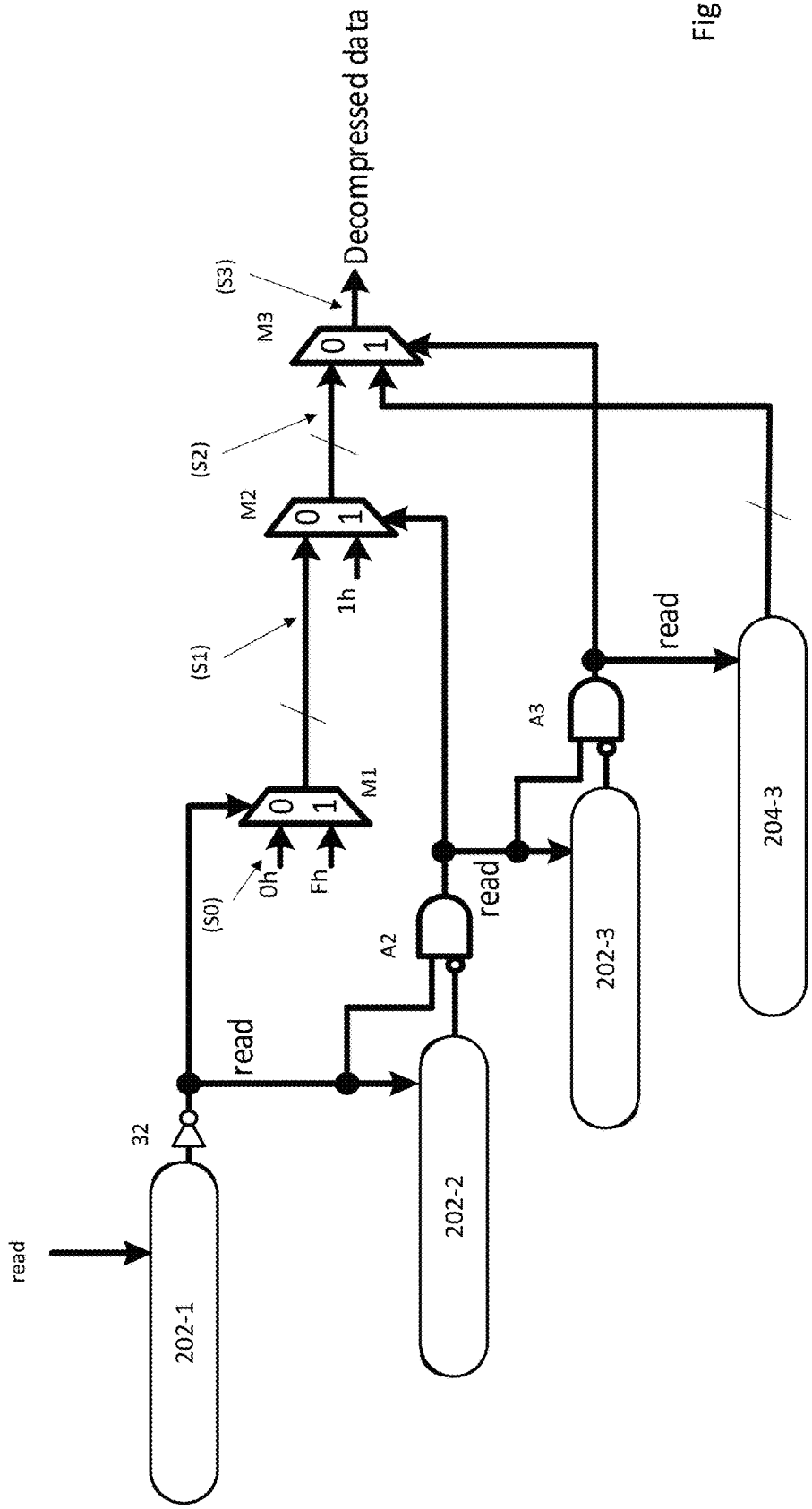
FIG. 3 illustrates schematically the operation of an apparatus for decompressing data according to embodiments of the present invention.

Now that the compression scheme has been described, we turn to the operation of apparatus for decompressing the data according to embodiments of the invention. FIG. 3 illustrates generally the steps performed with a decompression apparatus according to the present invention, where a file has been compressed as shown in FIG. 2.

The apparatus is based on a pipeline approach, with the pipeline comprising a number of stages including:
  a first stage which always reads a binary symbol from the first stage indicator file 202-1 for each symbol which is to be decoded;
  one or more mid stages which conditionally read a binary symbol from successive indicator files 202-2, 202-3 based on the value of the last symbol read from a previous indicator file 202-1, 202-3; and
  a final stage which conditionally reads a symbol from the reduced file 204-4 based on the value of the last symbol read from the last stage indicator file 202-3.

In the example of FIG. 2, there are 3 compression stages and so in FIG. 3, there are four stages in total with two intermediate decompression stages. However, it will be appreciated that where different files are compressed with different numbers of stages of compression, then switching circuitry can be provided to daisy chain hardware decompression stages together and this will be explained in more detail in relation to the example of FIG. 4.

The pipeline operates in phases with each phase producing a decompressed data symbol. In each phase, one symbol is read from the first stage indicator file 202-1 and this continues until the first stage indicator file is empty—each symbol read from the first stage indicator file 202-1 corresponds to a decompressed symbol.

If the symbol read is a 1, then the output of an inverter 32 driven by the first stage indicator file data will be 0. The output of the inverter 32 determines whether a symbol is read from the next (2$^{nd}$) stage indicator file 202-2 during a given phase. The output of the inverter 32 is also connected through successive AND gates A2 and A3 whose outputs determine whether a symbol is read from the next (3$^{rd}$) stage indicator file 202-3 or, in this case, final reduced file 204-4 during a given phase.

The output of the inverter 32 controls a multiplexer M1, while the outputs of AND gates A2 and A3 control respective cascaded multiplexers M2 and M3 where the output of a given multiplexor is an input for a successive multiplexer.

If the symbol read from the first stage indicator file 202-1 is 1 in a given phase, then the value at the low input of multiplexer M1 will cascade through multiplexers M1, M2 and M3 to become the decompressed output for that phase—in this case 0h.

If the symbol read from the first stage indicator file 202-1 is 0 in a given phase, then the value at the high input of multiplexer M1 will cascade through multiplexers M1, M2 and M3 to become the decompressed output for that phase—in this case Fh i.e. the system knows the value of the present symbol cannot be 0h, but it might be Fh.

If the symbol read from the first stage indicator file 202-1 is 0 in a given phase, then the read line for the next (2$^{nd}$) stage indicator file 202-2 is driven high and a symbol is read from that file and this will drive a second inverted input of the AND gate A2.

Thus, a symbol value of 1 from the ($2^{nd}$) stage indicator file 202-2, will prevent symbols being read from the next stage indicator file 202-3 and from the reduced file 204-3. This will also draw the Fh guess from the multiplexer M1 and through to provide the output of the multiplexer M2 for this phase. As the output of the AND gate A3 in this phase will also be 0, the output of the multiplexer M2 for this phase will propagate through to become the output of the multiplexer M3, and so the decompressed symbol for the phase.

Similar to the previous phase, if the symbol read from the second stage indicator file 202-2 is 0 in a given phase, then the value at the high input of multiplexer M2 will cascade through to multiplexer M3 where it may become the decompressed output for that phase—in this case 1h i.e. the system knows the value of the present symbol cannot be either 0h or 15h, but it might be 1h.

Again, if the symbol read from the second stage indicator file 202-2 is 0 in a given phase, this will cause a symbol to be read from the next ($3^{rd}$) stage indicator file 202-3. If this value is 1, then the value at the low input of the multiplexer M3, in this case, it will be 1h will be the decompressed symbol for the phase.

Otherwise, if the value is 0, then a symbol value is read from the reduced file 202-4. The high output from the AND gate A3 caused by the 0 value read from the indicator file 202-3 will cause the high input of the multiplexer i.e. the value read from the reduced file 204-4 to be the decompressed symbol for the phase.

As will be seen, the inputs to each of the multiplexers M1 to M3 are the width of decompressed symbols, whereas the controls for the multiplexers are binary.

It will be seen that in the example of FIG. 3 the logic involved in a given phase is combinatorial and if symbols are conditionally read from stage indicator files 202-2 and 202-3 as well as reduced file 204-3 at the same time, then each phase can be completed in a single clock cycle. Thus, the values at the front of the buffers storing the information from indicator files 202-2 and 202-3 as well as reduced file 204-3 are only popped conditionally based on their read signals and if so, replaced at the end of the phase for use in the next phase or a subsequent phase by the next symbol from the respective file. Otherwise, they remain to be popped until required by the output of the logic from previous stage(s).

Separately, FIG. 3 illustrates that each stage S0 . . . S3 provides their guess to a subsequent phase. So in the example of FIG. 3, where symbol 0h is compressed by the first stage (S0), this stage might guess that a given symbol could be 0h. If a symbol for a phase is not 0h after the first stage S0, then next stage (S1) might guess that the symbol for the phase is Fh. If the symbol for a phase is not 0h or Fh, then the next stage (S2) might guess that the symbol for the phase is 1h, and if none of these is the case, then the symbol value for a phase is read from the reduced file 204-3.

Figure 4:
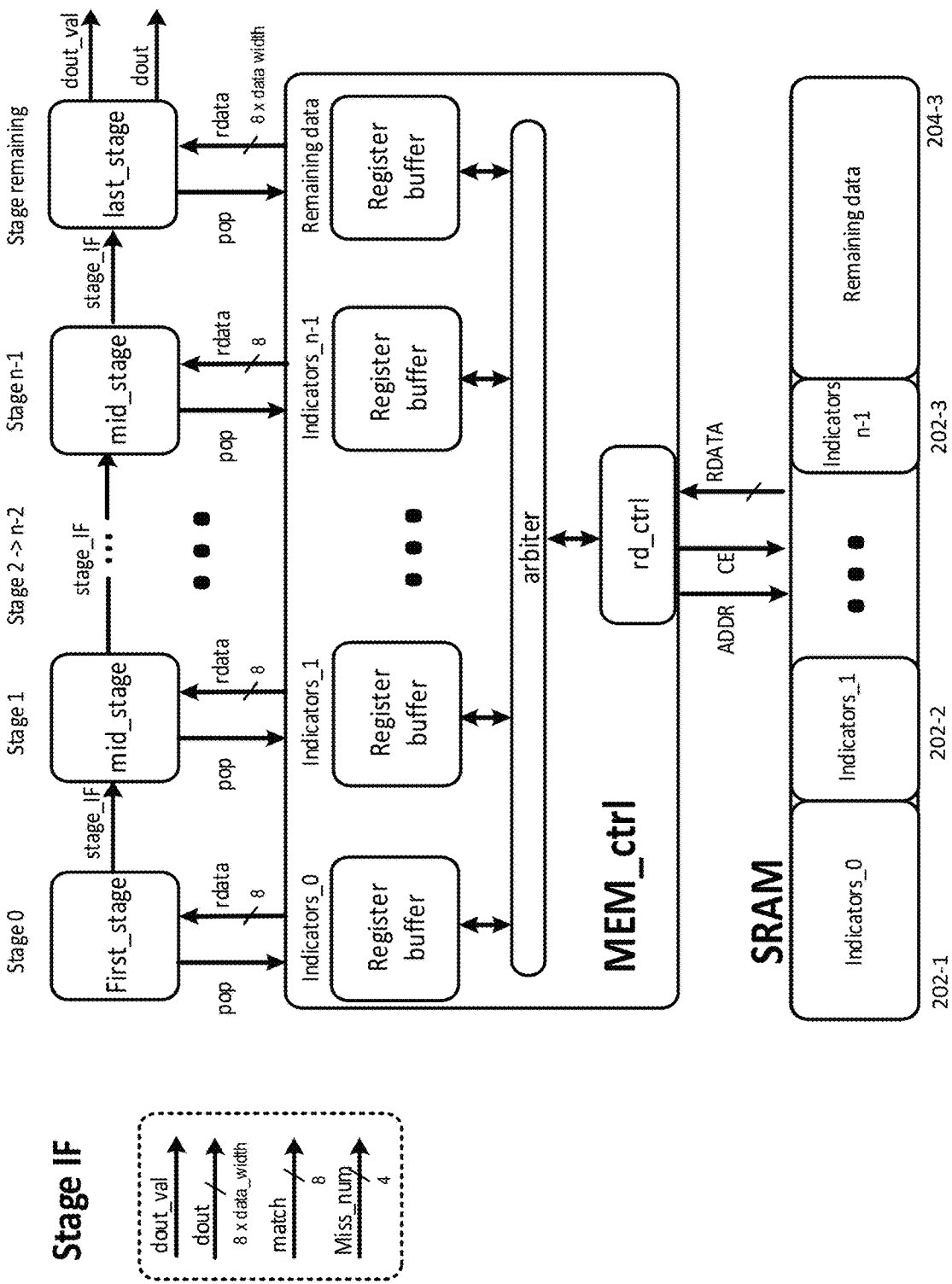
FIG. 4 illustrates in more detail an exemplary apparatus for decompressing data according to an embodiment of the invention.

Turning now to FIG. 4, there is shown a more detailed implementation of a decompression apparatus according to an embodiment of the present invention.

In this case, logic for each stage, First_stage, mid_stage . . . last_stage, provides 8 symbols per phase, but rather than all the calculations for all stages being performed at the same time in a given phase, they are daisy chained, one after another with the logic for each stage being interconnected through a stage interface (stage_IF). (It will also be appreciated that in variants of this multi-symbol approach, fewer or more symbols than 8 can be decompressed during each phase in accordance with the footprint available for the hardware.)

The logic for each stage requests its information from the compressed indicator and remaining data files stored in memory, in this case SRAM, through a common memory controller, MEM_ctrl. The memory controller includes a plurality of register buffers, each associated with a respective stage. The logic for each stage is able to request (POP) up to 8 symbols of data from their associated buffer at each phase of operation of the decompressor.

So looking at the first stage 0, assuming that the buffers shown have been populated as required as described in more detail below, in response to asserting its POP line during a first phase P1, this stage always reads 8 bits per phase from a FIFO register buffer In the example from FIG. 2, in the first phase P1, the $5^{th}$ and 8th bits from the indicator file 202-1 are 1 and so the first stage will populate those positions of a dout portion of its stage interface (stage_IF) with values 0h. (The values in the remaining positions of dout do not matter and will in any case be superseded by subsequent stages.) In the embodiment, an 8 bit template, match, indicates to the subsequent stage in a subsequent phase P2 that the guess for the $5^{th}$ and $8^{th}$ symbols are good, while the remaining symbols need to be determined. In the example, a miss_num value is also provided to indicate to the next stage, how many positions of the 8 bits produced by the stage remain undetermined. This tells the next stage how many symbols it needs to read from its register buffer—this could also be calculated by the next stage from the match template, but providing the value as shown enables phases to be executed by stages in a minimum of clock cycles, improving the timing performance by allowing the decompressor to operate at a higher frequency.

In the subsequent phase P2, the first stage 0 will again read another 8 bits from its register buffer and provide an output dout with symbol value 0h in $1^{st}$-$4^{th}$ bits positions and undetermined values in the remaining positions. The match template will indicate that the guesses for these positions are good, while the remaining symbols need to be determined.

In the present example, in the second phase P2, the second stage 1 will read the stage interface output from the first phase of stage 0. Miss_num tells the second stage that it needs to read (POP) 6 symbols from its indicators register buffer, as only 2 guesses were determined by the first stage in the previous phase. The 6 symbols read from the register buffer are mapped through multiplexer/switching logic (not shown) to the positions indicated by the match portion of the stage interface from the first phase of stage 0. Each of the symbol values read from the buffer are combined using logic similar to that shown in FIG. 3, to determine each of output values (guesses) for the file locations being processed by the stage during that given phase. The guesses from dout are fed through the second stage, as shown in FIG. 3, while 1 Fh symbol will be identified by the second stage in the $7^{th}$ position. Thus, the second stage interface output after the second phase P2 will be: dout=[x,x,x,x,0h,x,Fh,0h], match=[00001011], miss_num=5.

The third stage operates similarly in the third phase P3, reading 5 symbols from its indicator_n−1 register buffer, and matching 1 symbol in the $6^{th}$ position. Thus, the third stage interface output after the third phase will be: dout=[x,x,x,x,0h,1h,Fh,0h], match=[0001111], miss_num=4.

The fourth stage operates as before except that the 4 symbols it reads from the remaining data register buffer in the $4^{th}$ phase P4 will be symbol wide data, rather than binary.

The fourth stage will read one further symbol from the remaining data register buffer in each of phases P5 and P6, while it will not need to read any in phase P7 because all of the symbols for that portion of the original file will have been determined before that stage in phase P7.

It will be appreciated that the first valid output for the file from the last_stage will appear after the fourth phase P4. In the embodiment, dout_val is first asserted when the first stage reads the first data from its register buffer and this ripples through the stages until it is asserted by the last stage after the fourth phase P4. After the first stage reads the final data from the indicator register buffer, it de-asserts the dout_val and this ripples through to the output of the last stage, in this case, after the $7^{th}$ phase P7.

Thus, it will be seen that once the last stage begins to produce data, it will produce 8 decompressed symbols per phase until the compressed file is read. As will be seen from FIG. 3, each stage is based on combinatorial logic and so each phase can potentially execute within a clock cycle, so enabling the decompressor to produce multiple symbols of data per clock cycle.

FIG. 4 also indicates that variable numbers of stages can be daisy chained together. Thus, with suitable switching circuitry, the output from one stage can be fed either to the next stage or skip that stage, so allowing the hardware to decompress files which have been subject to varying stages of compression. In some cases, if only single stage compression were used for a file i.e. where it had a single dominant symbol, then all mid_stages would be switched out. In general though, compression involves multiple stages, as in the illustrated example of FIG. 2, and so the number of mid_stages provided needs to be sufficient to decompress the maximum number of stages used to compress such files.

Turning now to the filling of the register buffers in the decompressor of FIG. 4.

In the example, each register buffer forms part of a register buffer module including logic which is responsible for requesting and receiving data from a corresponding indicator file or remaining data file. The requests from all register buffer modules are arbitrated by an arbiter module and a winner is selected, especially when multiple requests are made at the same time. The winner is selected as the buffer module which most requires data from memory, for example, using urgency and demand as criteria. The amount of data provided in response to a request and the stage at which it is requested by the register buffer modules is set so that, even if all stages request data from memory at the same time, the data for subsequent winners will arrive in their buffer in time and ensure the buffer is not emptied before it can be re-filled. For example, the register buffer for stage 0 always requires 8 bits per phase and in a 3-stage compression implementation, the buffer module should request at least 32 bits when it is has less than 32 bits of data in its buffer to ensure its buffer does not empty before it next becomes a winner.

As a worked example, before a first phase P1, all register buffers will request data from the arbiter. In the present example, the register buffer for stage 0 will be given sufficient data for at least 4 phases, as it most urgently needs data to execute phase P1 and it needs to keep enough data in its buffer to ensure the buffer does not become empty while the register buffer next waits to become a winner. The next winner will be the register buffer for stage 1 which can receive its data sufficiently early to execute phase P2 as required (even if at this stage the register buffer for stage 0 will also be requesting data). The same will be the case when the register buffers for stage n−1 and the last stage become winners. The process will then repeat with the next winner likely to be the stage 0 register buffer with the other buffers then becoming winners as they require data from their respective indicator/remaining data files.

The winner is communicated by the arbiter to a read controller, rd_ctrl, module. The rd_ctrl module is configured to maintain a base address for each indicator file and the remaining data file. Using this information, the rd_ctrl module initiates a read from the memory, SRAM, from the corresponding base address by asserting a CE (read) signal and providing the base address on the address bus. The amount of data read by the read controller module in any given request can depend on whether data is being read from binary indicator files or the remaining data file. Recall that, in the example, 32 bits will suffice for 4 phases of the register buffer for stage 0, whereas this would only comprise information for 8 symbols from the remaining data buffer which may only be sufficient for one phase.

The amount of data provided in response to a single read request may also depend on the characteristics of the bus connecting the memory controller and memory, so where it is more efficient to request larger amounts of data across a bus, for example, where the memory controller is requesting data from memory across a system bus, then this will determine the amount of data requested by the memory controller at any given time and as such, the size of the buffers.

When a read is completed, the rd_ctrl module updates the base address for the indicator/remaining data file to follow the last address read from the indicator/remaining data file, so that the next read from a given indicator/remaining data file is performed from the updated base address for that file. So, as explained, each register buffer module is responsible for asking data from the arbiter module, if it needs new data, for example, if previously buffered data has been almost fully consumed. For each served request, a register buffer receives more data than the corresponding stage will consume in at least one phase, so each register buffer will request for new data occasionally, according to the rate of consumption.

It should be appreciated that the decompressor of FIG. 4 is provided for exemplary purposes and other architectures based on the general principle shown in FIG. 3 are also possible. In particular, such architectures might not rely on an arbiter as shown in FIG. 4 and instead may read data into the respective buffers in a more deterministic fashion.

Note that in some implementations, it can be useful to break a file into chunks, for example, FIG. 2 shows a 32 symbol chunk for a file. The read controller reads all indicator files for a chunk until they are exhausted. When the indicators_0 file for a chunk is exhausted, all of the buffers for the chunk will also have been exhausted and so the process can begin again for a new chunk. Breaking a file into chunks in this manner means that separate chunks can be decompressed in parallel by separate decompressors.

The invention claimed is:

1. An apparatus for decompressing a file comprising:
a first stage indicator file comprising a first binary symbol for each symbol of at least a portion of a file, a first binary value at a first symbol location indicating the presence of a most frequently occurring symbol value at said first symbol location and a second binary value at a second symbol location indicating the presence of a less frequently occurring symbol value at said second symbol location;
one or more mid-stage indicator files each comprising a second binary symbol for each symbol of said portion of the file remaining to be decompressed after more frequently occurring file symbols have been decompressed, a third binary value at a third symbol location indicating the presence of a next most frequently occurring symbol value at said third symbol location and a fourth binary value at a fourth binary symbol location indicating the presence of a less frequently occurring symbol value at said fourth binary location; and a remainder file comprising symbol values for each symbol of said portion of said file remaining to be decompressed after most frequently occurring file symbols have been decompressed, said apparatus:

decompresses the portion of the file in a first decompression stage by reading the first binary symbol from the first stage indicator file for each binary symbol of the at least the portion of the file, said stage being responsive to said binary symbol value indicating the presence of a most frequently occurring binary symbol value at said location for providing said binary symbol value as the symbol value for said location to one or more mid decompression stages;

decompresses the portion of the file in one or more mid decompression stages in response to a value of the last symbol read from the first stage indicator file not indicating the presence of a more frequently occurring symbol value at said location, by reading the second binary symbol from the one or more mid-stage indicator files and responsive to a next available symbol value indicating the presence of the next most frequently occurring symbol value at said location for providing said symbol value as the symbol value for said location to a final decompression stage; and decompresses said remainder file in a final decompression stage by conditionally reading a next available symbol from said remainder file based on the value of the last symbol read from the one or more mid-stage indicator files not indicating the presence of a more frequently occurring symbol value at said location.

2. The apparatus according to claim 1 wherein said portion of a file comprises one of a plurality of chunks of a file.

3. The apparatus according to claim 1 wherein said first stage is configured to: read multiple symbols from a first stage indicator file in a given phase of operation of said apparatus; and provide an indication to a subsequent stage of which symbol values indicate the presence of the most frequently occurring symbol value at respective locations in said first stage indicator file for a subsequent phase of operation.

4. The apparatus of claim 3 in which each of said one or more mid stages is configured to:

read zero or more symbols from a respective indicator file in a given phase of operation of said apparatus in accordance with the number of locations indicated by a previous stage as not comprising a more frequently occurring symbol value at respective locations in a previous phase of operation;

and provide an indication to a subsequent stage of which symbol values indicate the presence of more frequently occurring symbol values at respective locations in said first stage indicator file for a subsequent phase of operation.

5. The apparatus of claim 4 in which said final stage is configured to read zero or more symbols from said remainder file in a given phase of operation of said apparatus in accordance with the number of locations indicated by the previous stage as not comprising a more frequently occurring symbol value at respective locations in a previous phase of operation.

6. The apparatus of claim 1 further comprising switching circuitry configured to selectively connect one or more of said mid stages between said first and said final stage in accordance with the number of stages of compression of said compressed file.

7. The apparatus of claim 3 wherein an interface between each pair of successive stages comprises said indication of which symbol values indicate the presence of more frequently occurring symbol values at respective locations in said first stage indicator file and one or more of: a binary indication of said respective locations in said first stage indicator file in which more frequently occurring symbol values have been determined; an indicator of the number of more frequently occurring symbol values which have been determined at said respective locations in said first stage indicator file; and an indication of where the output from the previous stage is valid or not.

8. The apparatus of claim 5 wherein said each stage is configured to read said multiple symbols from a respective, FIFO, buffer.

9. The apparatus of claim 8 further comprising a memory controller which is configured to selectively read a plurality of symbols from one of: said first stage file, said one or more mid-stage indicator files and said remainder file, into a respective buffer sufficient to allow the buffer to provide the required symbols to the associated stage during one or more subsequent phases of operation of said apparatus.

10. The apparatus of claim 9 wherein each buffer is associated with logic which is configured to request symbols for the buffer when the number of symbols in the buffer is not sufficient for one or more subsequent phases of operation of said apparatus.

11. The apparatus of claim 10 wherein said memory controller further comprises an arbiter configured to select one from a plurality of requests made at the same time by respective buffer logic for a plurality of buffers.

12. The apparatus of claim 8 wherein each decompressed symbol comprises at least a 4 bit value.

13. A neural network processing apparatus including the decompressing apparatus according to claim 1, each of said first stage indicator file, said one or more mid-stage indicator files and said remainder file being stored in a non-volatile memory accessible to said apparatus, said symbols comprising values for weights employed in processing one or more layers of a neural network.

14. The apparatus according to claim 13 wherein said memory is accessible to said decompressing apparatus across a system bus.

15. The apparatus of claim 1, wherein said decompressing apparatus is configured to decompress the file using variable numbers of stages that are daisy-chained together, and wherein said decompressing apparatus comprises a switching circuit configured to allow said decompressing apparatus to decompress the file by either feeding output from one of the variable numbers of stages to a next stage of the variable numbers of stages of decompression or skip the next stage to adapt to varying stages of compression.

* * * * *